Jan. 17, 1956 J. A. SOBEL III 2,731,609

SLIDING CONNECTOR FOR PRINTED CIRCUIT BOARDS

Filed Sept. 29, 1954 2 Sheets-Sheet 1

INVENTOR.
John A. Sobel, III
BY
ATTORNEY.

SLIDING CONNECTOR FOR PRINTED CIRCUIT BOARDS

Filed Sept. 29, 1954

INVENTOR.
John A. Sobel, III
BY Morris A. Rabkin
ATTORNEY.

2,731,609

SLIDING CONNECTOR FOR PRINTED CIRCUIT BOARDS

John A. Sobel III, Collingswood, N. J., assignor to Radio Corporation of America, a corporation of Delaware Application September 29, 1954, Serial No. 459,104

7 Claims. (Cl. 339—17)

This invention relates to a connector and, more particularly, to a sliding connector for use with printed circuit boards.

In the development of electronic apparatus for mass production, increasing attention has been given to the physical arrangement of the apparatus in order to decrease the size and to permit ready access for servicing of such apparatus and, also, to increase the adaptability of such apparatus to mass production methods.

The development of printed circuitry has been a substantial step toward the attainment of these ends and the present invention is concerned with a connector for use in conjunction with printed circuit boards or modules which have printed terminals spaced along the edges thereof whereby the modules may be connected to other portions of the circuit.

A principal object of this invention, therefore, is to provide a novel connector for use with printed circuit boards or modules.

Another object of this invention is to provide a novel connector for use with printed circuit boards in which a board may be inserted either from a face of the connector or from an end thereof.

A further object of this invention is to provide a novel connector in which a printed circuit board may be inserted or removed from an end thereof without engaging the connector contacts during said insertion or removal.

A still further object of this invention is to provide a novel connector for use with printed circuit boards wherein the danger of stripping the printed terminals from the boards during insertion and removal thereof is substantially eliminated.

A still further object of this invention is to provide a novel connector which provides for electrical connection in six alternative paths.

To accomplish these and, perhaps, other objects a connector is provided which is made up of an elongated rectangular block composed of an insulating material. For the purpose of description, the block is assumed to be oriented in a horizontal position. Grooves are provided along the sides of the block to produce a substantially I-shaped cross section. The lower flanges of the connector support the edges of printed circuit boards. A plurality of vertical apertures are spaced along the connector and extend through it. These apertures are provided for the accommodation of vertical conductors which pass through the connector. Spring contact members are attached to the under side of the connector at points adjacent the vertical apertures and are connected to the conductors extending through these apertures. These contacts extend through apertures provided in the lower flanges so that the contact tips lie over the lower flanges on either side of the connector. Spring means are attached to the upper flanges and are provided to urge the printed boards against the lower flange and to thereby press the printed board terminals against the contact tips. Ridges are provided on the lower flanges to cooperate with notches provided in the printed boards for holding the boards away from the contacts while the boards are being inserted and for locking the boards into place when they are inserted.

The novel features of the invention, as well as additional objects and advantages thereof, will be understood more fully from the following description when read in connection with the accompanying drawings, in which.

Figures 1, 2, 8:
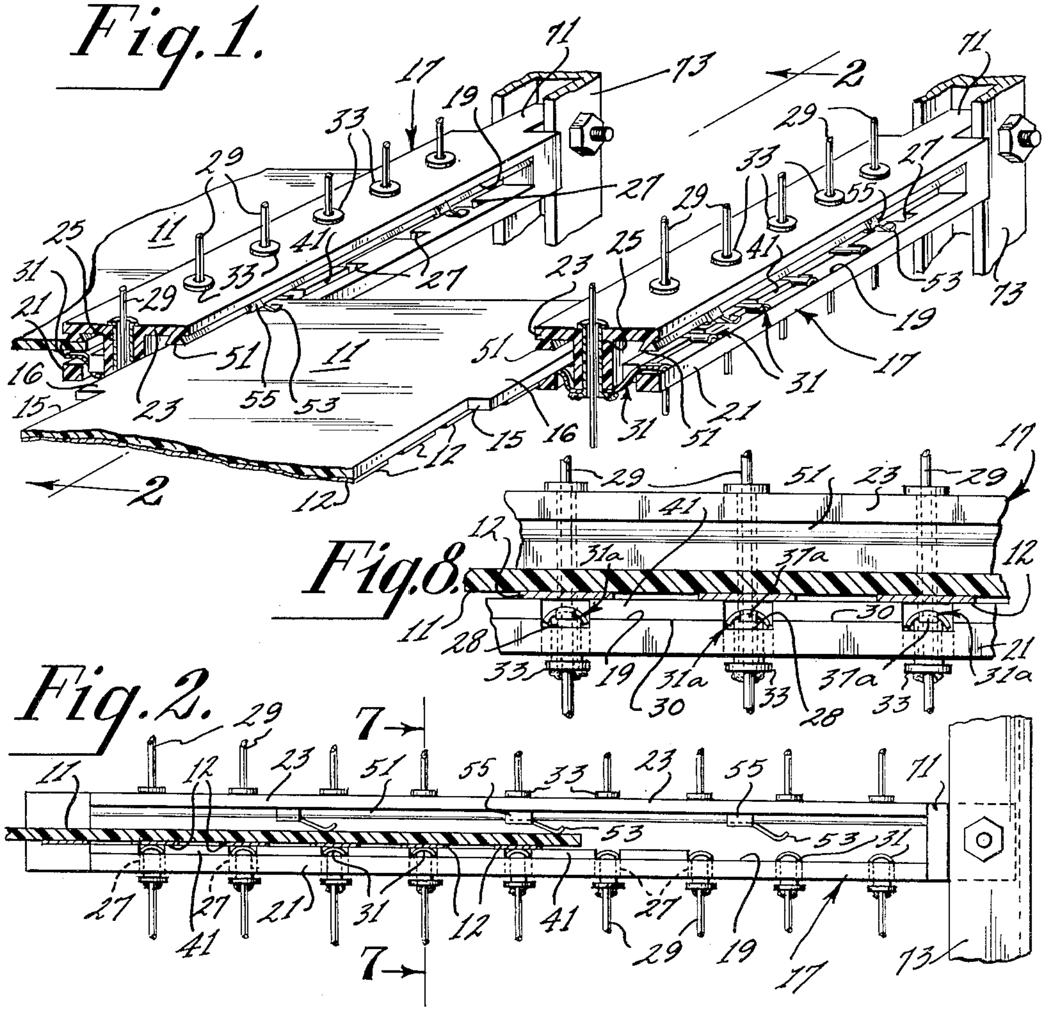
Figure 1 is a perspective view partially in section of a pair of connectors in accordance with the present invention supporting several printed circuit boards.
Figure 2 is a side elevational view partially in section of a connector taken along the line 2—2 of Figure 1 and showing a printed board partially inserted therein.
Figure 8 is a fragmentary side view of an alternative form of connector in accordance with the present invention.
Figure 3:
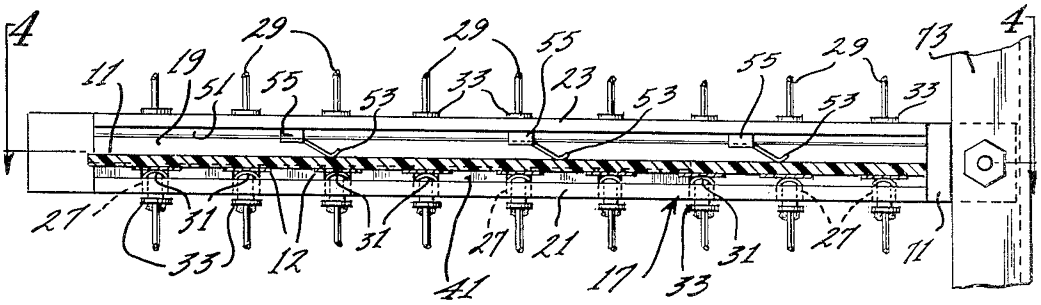
Figure 3 is a view similar to Figure 2 showing a printed board fully inserted in a connector.
Figure 4:
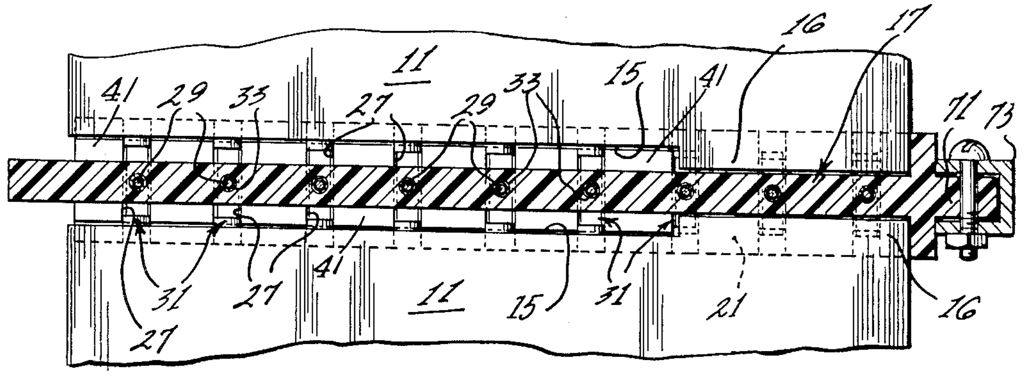
Figure 4 is a sectional plan view of a connector taken along the line 4—4 of Figure 3 and looking in the direction of the appended arrows.

Referring in more detail to Figures 1 through 4 and 7 of the accompanying drawings and especially to Figure 1 thereof, a circuit board 11 is shown being supported between a pair of connectors 17. The circuit board 11 has an essentially rectangular shape and has a plurality of printed terminals 12 on the under side thereof arranged in two parallel rows adjacent opposite edges thereof. These terminals 12 are spaced at definite predetermined intervals. Electrical or electronic components, which are mounted on the board 11, are electrically connected by means of printed wiring to the terminals 12. A rectangular notch 15 is cut out of each of the two edges of the board 11 having the printed terminals. This results in a board having a distorted T shape, the branches of the T being formed by tabs 16. The purpose of these notches 15 and tabs 16 will be described subsequently.

The connector 17 is or may be formed from an elongated rectangular block which is composed of an insulating material. The block is provided with rectangular grooves 19 which extend longitudinally along the sides thereof to provide lower flanges 21 and upper flanges 23 and consequently a substantially I-shaped cross section for the connector 17. These grooves terminate at one end of the connector 17.

A number of parallel apertures 25 extend through the connector 17 from top to bottom and are aligned in a vertical plane which divides the connector along its longitudinal dimension. A number of apertures or openings 27 are provided in each of the lower flanges 21, and extend through these flanges. These apertures 27 are aligned in pairs transversely of the longitudinal dimension of the connector and each pair is further aligned with one of the apertures 25. These aligned sets of apertures are spaced to correspond to the spacing of the terminals 12 of the printed boards 11.

Each of the apertures 25 is provided to accommodate a vertical conductor 29 which, in turn, provides the electrical connections between the connector 11 and other parts of a circuit in which the connector is employed.

Figures 6, 7:
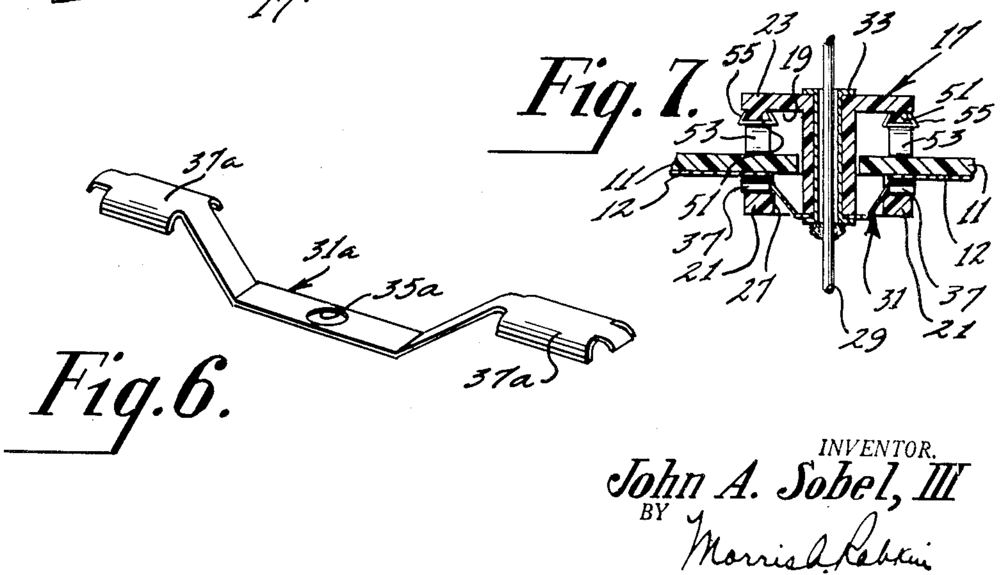
Figure 6 is a perspective view of a connector contact.
Figure 7 is a sectional end view of a connector taken along the line 7—7 of Figure 2 and looking in the direction of the appended arrows.

A contact 31 is secured to the under side of the connector adjacent each of the apertures 25. These contacts 31 are secured to the connector by means of rivets 33 which extend through the apertures 25 and are hollow to accommodate the conductors 29. The contacts 31 are made up of a strip of a resilient metal having an aperture 35 intermediate its ends for the reception of a rivet and having enlarged tip portions 37 at each end to provide a larger contact area. A contact 31 is illustrated in Figure 6. Each contact 31 extends from the point where it is secured to the connector, outwardly toward each edge of the connector, then upwardly through one of the apertures 27 in each of the lower flanges, then outwardly so that the enlarged tip portions 37 will lie over the outer edges of the lower flanges 21. The conductors 29 are connected to the rivets 33 by soldering or other means of making good electrical connection. This particular means for mounting the contacts 31 is not critical to the invention, it being necessary only that a good electrical connection is made between the contacts and conductors. It is desirable, but not necessary, that the contacts be constructed in one piece to extend across the connector. A number of these contacts have been omitted from Figure 1 in order to more clearly illustrate the configuration of the connectors. A ledge 41 is provided on each of the lower flanges 21. As viewed from the top of the connector, these ledges have a rectangular edge contour corresponding with the contour of a notch 15 in a printed board 11. Each ledge extends from the open end of its corresponding groove 19 toward the closed end thereof and ends short of the closed end. The space between the end of the ledge 41 and the end of its corresponding groove is substantially equal to the width of a tab 16 on a printed board 11. The ledges 41 are illustrated as being broken or discontinuous as a result of the apertures 27. This is merely a feature of the particular design illustrated and is immaterial insofar as the function of the ridge is concerned. This function will be described subsequently.

The upper flanges 23 are provided with flared or dovetailed ribs 51 on the under side thereof and which extend over the length of the connector. These ribs 51 are provided to support springs 53 which are spaced along the connector and which urge the printed boards downwardly toward the lower flanges 21 and hence press the printed terminals 12 against the contact tips 37 for good electrical contact.

Each of the springs 53 is made up of a resilient metal strip having lateral tabs 55 at one end which extend from either edge of the strip. These tabs 55 are bent to form a clip portion of the spring which is dimensioned to clamp over a dovetailed rib. The other end of the spring is bent out of the plane of the clip portion so that it will bear against a board 11. These springs 53 are illustrated in Figures 2 and 7.

When a board 11 is being inserted into the grooves of two adjacent connectors the springs 53, in forcing the board toward the lower flanges 21, cause the board terminals 12 to pass over the connector contacts 31. It is not desirable that the terminals 12 and the contacts 31 engage each other at this time because where there are a considerable number of contacts in each connector, the board terminals, especially the terminals toward the leading edge of the board, are subject to considerable wear. Since these terminals are of limited thickness and relatively fragile, it is desirable to provide a means to prevent the engagement of the terminals 12 and the contacts 31 until such time as the board has reached its assembled position in the connector. This means is provided by the connector ledges 41 and by the board notches 15 and tabs 16. The width of a board 11 at the point where the notches 15 are provided is equivalent to the distance between the ledges 41 of adjacent connectors. Hence, when the board 11 is inserted into the connectors, the tabs 16 of the board 11 will slide along the ledges 41 until the board reaches the end of the grooves 19 at which time the notches 15 will be in position to accommodate the ledges 41 and the tabs 16 will be disposed over the spaces between the ledges 41 and the ends of the grooves 19. The board then will be forced downwardly into contact engaging position by the springs 53.

In addition to providing a means for protecting the circuit board terminals 12 this ledge and notch arrangement provides an indexing and locking means for the assembly. When the leading edge of the board reaches the end of the grooves 19, the board will snap downwardly indicating to the operator that the board is in the correct position for the operation of the circuit. Furthermore, it is practically impossible for the board to be jarred or vibrated loose from this position during the operation of any equipment in which the circuit structure might be employed. In order to remove a board from the assembly, it is necessary to move the board upward to disengage the tabs 16 from the ends of the ledges 41, whence the board might be removed from the grooves 19.

A mounting extension 71 is provided at each end of the connector 17 so that the connector may be supported by a vertical channel member 73, for example.

Figure 5:
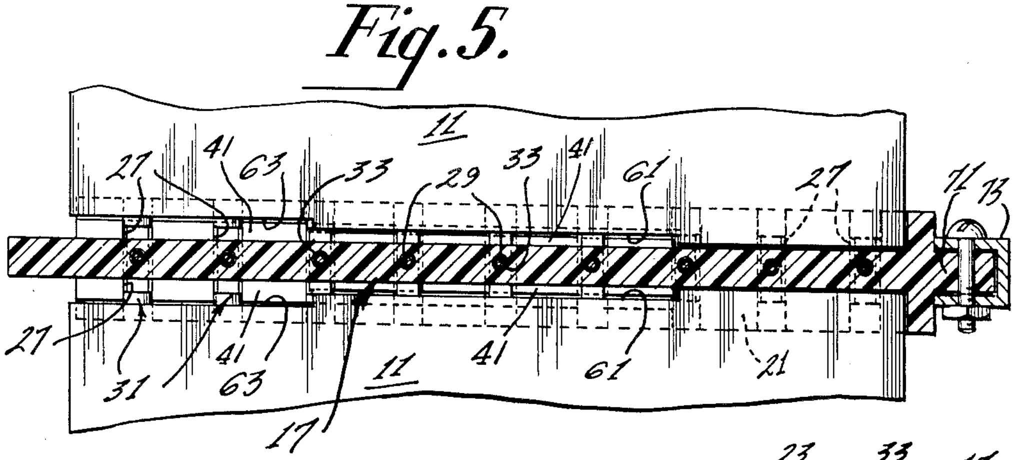
Figure 5 is a view similar to Figure 4 of an alternative form of connector in accordance with the present invention.

Referring now to Figure 5 an alternative form of connector 17 is illustrated. This connector is similar in design of the above-described connector except that it is designed for use with a circuit board 11 which has a pair of successive notches 61 and 63 cut out of each of the two edges of the board having the printed terminals 12 thereon. By this means stepped edges are provided on the board 11. The contour of the ledges 41 will again correspond to the contour of the board edges, and therefore will not appear as rectangular surfaces as viewed from the top of the connector. A feature of particular structure is that while the board is being inserted between a pair of connectors, it will be maintained in the plane of the upper ledge surfaces. In the principal embodiment of the invention only the tabs 16 of the board 11 engage the ledge 41 while the board is being inserted. With the stepped edge and notch arrangement however, the board will be supported over a greater portion of its length by the ledges 41 until it reaches the snap in position and hence will provide for greater stability and ease of insertion.

According to the present invention while the connector has been developed primarily for use with circuit boards which will be inserted from the ends of the connectors, the design of the connector also permits a board to be inserted into the connector from the side of the connector where this is desirable in a particular circuit arrangement. In order to facilitate this use, a contact **31*a* may be used which will have spoon type tip portions 37*a*. An example of such a contact 31*a* is illustrated in Figure 6. The springs 53** might be formed to have a similar type end at the points where they bear against the printed circuit boards.

Referring now to Figure 8, another alternative form of connector is illustrated. In this embodiment a number of transverse grooves 28 are provided along each of the lower flanges 21 at the points where the contact tip portions **37*a* lie on these flanges. These notches then are aligned in a transverse direction with the apertures 27 which extend through these flanges. These grooves 28, in effect, will form transverse ridges 30 which will act as barriers between the tip portions 37*a* of the adjacent contacts 31*a* and serve to prevent electrical interference between these contacts while the circuit is functioning. These ridges 30** will further tend to prevent any physical displacement or misalignment of the contacts which might possibly result during the insertion or removal of the boards from the connectors.

The principal features of the connector, as already pointed out, are the means for holding the board away from the contacts during insertion and removal of the board, and the indexing and locking arrangement provided therein.

Another feature of this connector is that at each of the contacts six possible electrical paths are provided as follows: A path is provided directly across the connector from one board to another. Another path is provided directly through the connector by means of a conductor 29. Alternative paths are provided from a board on one side of the connector either upwardly or downwardly through a conductor 29. The fifth and sixth paths are provided from a board on the other side of the conductor either upwardly or downwardly through a conductor 29. Hence, the conductor when used in an electrical assembly, provides for great versatility in circuit arrangement.

What is claimed is:

1. A connector for use with a printed circuit board having terminals spaced along at least one of two parallel edges thereof, said board having a tab extending from each of said parallel edges at one end thereof, said connector comprising an elongated member having longitudinal grooves extending along either side and terminating at one end thereof forming upper and lower flanges and having transverse apertures aligned therealong and extending therethrough from top to bottom, an electrical conductor extending through each of said transverse apertures, electrical contact members mounted on said connector and attached at an intermediate point to each conductor, the free ends of each of said contact members extending through each of said lower flanges and being disposed above said flanges, a ledge extending along each of said lower flanges, each of said ledges being discontinuous at the closed end of its corresponding groove, the length of said discontinuity corresponding to the width of said tab, and means mounted on each of said upper flanges for urging said printed circuit board downward toward its corresponding flange, said tab being adapted to ride on said ledge when said board is being inserted from the open end of said groove, said board being urged downwardly by said last-named means when said tab moves off said ledge at said closed end of said groove whereby said tab is received in said discontinuity.

2. A connector for use with a printed circuit board having terminals spaced along parallel edges thereof, said board having tabs extending from said parallel edges at one end thereof, said connector comprising an elongated member having longitudinal grooves extending along either side and terminating at one end thereof forming upper and lower flanges and having transverse apertures aligned therealong and extending therethrough from top to bottom, said lower flanges having openings extending therethrough, one of said openings in each of said flanges being aligned transversely of said connector with one of said transverse apertures, an electrical conductor extending through each of said transverse apertures, an electrical contact member mounted on said connector adjacent each of said conductors and attached thereto, portions of each of said contact members extending through each of said lower flanges and being disposed above said flanges, a raised ledge extending along each of said flanges, said ledge being discontinuous at the closed end of said groove, the length of said discontinuity corresponding to the width of said tab, and means mounted on each of said upper flanges for urging a printed circuit board downward toward said lower flanges, said tab being adapted to ride on said ledge when said board is being inserted from the open end of said groove, said board being urged downwardly by said last named means when said tab moves off of said ledge at the closed end of said groove whereby said tab is indexed and locked in said discontinuity.

3. A connector for use with a printed circuit board having terminals spaced along parallel edges thereof, said board having tabs extending laterally from said parallel edges at one end thereof, said connector comprising an elongated member having longitudinal grooves extending along either side thereof to form upper and lower flanges and having transverse apertures aligned therealong and extending therethrough from top to bottom, said grooves terminating at one end thereof, said lower flanges having apertures aligned therealong and extending therethrough, one of said apertures in each of said lower flanges being aligned transversely of said connector with one of said transverse apertures, an electrical conductor extending through each of said transverse apertures, an electrical contact member mounted on the underside of said connector adjacent said conductors and attached thereto at an intermediate point of said contact member, each of said contact members extending from said conductor through each of said lower flanges and having its free ends disposed above said flanges, a ledge extending along each of said flanges having a ledge surface raised above said free ends of said contacts, each of said ledges being discontinuous toward the closed end of said groove, the length of said discontinuity corresponding to the width of said tab, and spring means mounted on each of said upper flanges for urging a printed circuit board downwardly toward a respective lower flange, said tab being adapted to ride on said ledge when said board is being inserted from the open end of said groove, said board being urged downwardly by said last named means when said tab moves off of said ledge at the closed end of said groove whereby said tab is indexed and locked in said discontinuity.

4. A connector for use with a printed circuit board having terminals spaced along parallel edges thereof and having a rectangular notch in each of said parallel edges, said connector comprising an elongated member having grooves extending along either side thereof to form upper and lower flanges and having vertical apertures aligned therealong and extending therethrough, each of said grooves being adapted to longitudinally receive an edge of a printed circuit board, each of said lower flanges having openings extending therethrough, an electrical contact member mounted on said connector adjacent each of said vertical apertures, a portion of each of said contact members extending through said flange openings and lying over each of said flanges, a ledge on each of said lower flanges corresponding in length to the length of one of said notches in said printed circuit board, each of said notches being dimensioned to accommodate one of said ledges when said circuit board is completely inserted in said groove, means mounted on each of said upper flanges for urging said circuit board downwardly against said lower flanges, and a conductor extending through each of said vertical apertures and being connected to one of said contact members adjacent thereto.

5. A connector for use with printed circuit boards having terminals spaced along parallel edges thereof and having a rectangular notch in each of said parallel edges, said connector comprising an elongated member having longitudinal grooves along either side thereof to form upper and lower flanges and having vertical apertures aligned therealong and extending therethrough, each of said grooves being adapted to longitudinally receive an edge of a printed circuit board, each of said lower flanges having apertures aligned therealong and extending therethrough, one of said apertures in each of said flanges being transversely aligned with said vertical apertures, an electrical contact member mounted at a point intermediate its ends on said connector adjacent each of said vertical apertures, said contact member having free ends extending through said apertures in said lower flanges and lying over said flanges, the ends of said contact members being spaced along each of said flanges to correspond to the spacing of said printed circuit terminals, a ledge on each of said lower flanges disposed above said contact members and corresponding in length to the length of one of said notches in said printed circuit board, each of said notches being dimensioned to accommodate one of said ledges when said circuit board is completely inserted in said groove, spring means mounted on each of said upper flanges for urging said circuit board downwardly against a corresponding lower flange whereby said ledges are received in said notches, and a vertical conductor extending through each of said vertical apertures and being electrically connected to said contact members mounted adjacent thereto.

6. A connector for use with printed circuit boards having spaced terminals aligned in parallel rows adjacent opposite edges thereof, said edges having a stepped contour, said connector comprising an elongated member having longitudinal grooves along either side thereof to form upper and lower flanges and having vertical apertures aligned therealong and extending therethrough, each of said grooves being adapted to receive a stepped edge of a printed circuit board, each of said lower flanges having apertures aligned therealong and extending therethrough, one of said apertures in each of said flanges being aligned transversely of said connector with one of said vertical apertures, an electrical contact member mounted at a point intermediate its ends on said connector adjacent each of said vertical apertures, the ends of said contact members extending through said apertures in said flanges and lying over said lower flanges, the ends of said contact members being spaced along each of said flanges to correspond to the spacing of said printed terminals, a ledge on each of said lower flanges extending above said contact members and having a longitudinal stepped configuration corresponding to said stepped edge of said printed circuit board, means mounted on each of said upper flanges for urging a circuit board downwardly against its corresponding lower flange, a portion of said stepped edge of said printed circuit board riding on said stepped ledge when said board is inserted longitudinally in said groove, said board moving downwardly adjacent said ledge when said board is completely inserted in said groove, and a vertical conductor extending through each said vertical apertures and being connected to said contact member mounted adjacent thereto.

7. A connector for use with a printed circuit board having spaced terminals aligned in parallel rows adjacent opposite edges thereof, said board having stepped out portions along said edges, said connector comprising an elongated insulating member having a substantially I-shaped cross section, said section being composed of a central portion and parallel upper and lower flanges extending laterally from either side of said central portion, said central portion having a plurality of vertical apertures aligned therealong extending therethrough, a spring contact secured at a point intermediate its ends to the under side of said connector adjacent each of said apertures, each of said contacts being secured by a hollow rivet extending through said apertures, each of said lower flanges providing a support for a stepped edge of said printed circuit board, each of said lower flanges having openings extending therethrough, the free ends of each of said spring contacts extending through one of said openings in each of said lower flanges and lying over each of said lower flanges, a ridge on each of said lower flanges extending above said contacts, said ridge being provided to support said circuit board out of engagement with said spring contacts when said board is inserted longitudinally into said connector, the contour and length of each of said ridges corresponding to the contour and length of the said stepped edge of said printed circuit board, spring means mounted on each of said upper flanges for urging said printed boards downwardly whereby said spaced terminals will be pressed into engagement with said spring contacts, when said boards are completely inserted in said grooves, a portion of said stepped edge riding on said stepped ridge while said board is being inserted longitudinally in said groove, said board moving downwardly adjacent said ridge when said board is completely inserted in said groove, and a vertical conductor extending through each of said hollow rivets in said vertical apertures and being electrically connected to said rivets.

References Cited in the file of this patent

UNITED STATES PATENTS

| | | |
|---|---|---|
| 2,446,232 | Koenig | Aug. 3, 1948 |
| 2,566,064 | Keim | Aug. 28, 1951 |